United States Patent

Baur et al.

[19]

[11] Patent Number: 6,019,614
[45] Date of Patent: Feb. 1, 2000

[54] ELEMENT FOR PROVIDING ELECTRICAL CONNECTION BETWEEN A PRINTED CIRCUIT BOARD BONDING PAD AND A METALLIC HOUSING PART

[75] Inventors: Richard Baur, Pfaffenhofen; Günter Fendt; Klaus Wierzioch, both of Schrobenhausen, all of Germany

[73] Assignee: Temic Telefunken microelectronic GmbH, Heilbronn, Germany

[21] Appl. No.: 09/109,176

[22] Filed: Jul. 2, 1998

[30] Foreign Application Priority Data

Jul. 2, 1997 [DE] Germany ................. 197 28 291

[51] Int. Cl.[7] ................................................. H01R 4/66
[52] U.S. Cl. ................................. 439/92; 439/883
[58] Field of Search ............................ 439/92, 883, 868, 439/860, 83, 84

[56] References Cited

U.S. PATENT DOCUMENTS

| | | |
|---|---|---|
| 3,066,367 | 12/1962 | Garman . |
| 4,927,367 | 5/1990 | Salvagno ........................ 439/92 |
| 5,138,529 | 8/1992 | Colton et al. ................... 439/95 |
| 5,443,391 | 8/1995 | Maeda et al. ................... 439/84 |
| 5,500,789 | 3/1996 | Miller ............................. 354/344 |
| 5,519,169 | 5/1996 | Garrett ........................... 216/750 |
| 5,749,740 | 5/1998 | Swift et al. ..................... 439/92 |

FOREIGN PATENT DOCUMENTS

29603747U1 6/1996 Germany .
08069826A 3/1996 Japan .

OTHER PUBLICATIONS

Patent Abstracts of Japan vol. 096, No. 007, Jul. 31, 1996 & JP 08 069826 A (San Electric Co. Ltd), Mar. 12 1996 Zusammenfassung.

Primary Examiner—Gary F. Paumen
Attorney, Agent, or Firm—Venable; George H. Spencer; Norman N. Kunitz

[57] ABSTRACT

For electrically and mechanically connecting a printed circuit board bonding pad to a metallic housing part, in particular for connecting to ground, friction-type connections such as screw fastenings or rivets are usually provided for connecting the printed circuit board directly to the housing part. However, since the printed circuit boards are mostly made of plastic material and the forces at the friction-type connections diminish, the electrical connection may become loose, especially in the aging process. To prevent this a connecting element comprising a base surface having a hole for inserting the friction-type connection to the housing part and at least one contact finger on the base surface are provided, whereby the contact finger provides connection to the printed circuit board bonding pad. The base surface is insensitive to mechanical loads at the friction-type connection and can distribute these evenly. Electrical connection is guaranteed and fabrication simplified.

17 Claims, 2 Drawing Sheets

ELEMENT FOR PROVIDING ELECTRICAL CONNECTION BETWEEN A PRINTED CIRCUIT BOARD BONDING PAD AND A METALLIC HOUSING PART

BACKGROUND OF THE INVENTION

The invention relates to an element for providing electrical connection between a printed circuit board bonding pad and a metallic housing part via a friction-grip metal component.

In practice, electrical connections between a printed circuit board bonding pad and a metallic housing part, in particular for connecting to ground via the housing, are in most cases made via the friction-grip metallic part, usually a screw or a rivet, by pressing the electrical printed circuit board bonding pad against or onto the metallic housing part. However, since the printed circuit boards are of plastic material, they become deformed under the action of compression force in the aging process, which means that the quality of the electrical connection cannot be guaranteed over the life of the product. For this reason a separate grounding connection has been hitherto provided via a pin in the connector to guarantee secure ground bonding over the life of the product. Outside the subassembly the ground line is then bonded by tapping from the connector directly to the grounding metallic housing part by means of a cable lug which, however, is a very complex operation, as an additional pin in the connector, a tapping element, an external ground line and a cable lug are required and have to be fitted.

In a further solution the printed circuit board exhibits metallizations on both sides in the area of the printed circuit board bonding pad that are interconnected through the board by means of a feedthrough, as can be seen from U.S. Pat. No. 4,927,367, for example. Here, too, a deformation of the printed circuit board over the life of the product cannot be ruled out. Other grounding connections are described in DE 296 03 747 U1 and, in the form of elastic springs not having a mechanical load-bearing function, in U.S. Pat. No. 5,138,529 and U.S. Pat. No. 3,066,367.

Particularly worthy of note is JP 08069826, which describes a connecting element having a contact finger that is fixed in a hole in the printed circuit board by soldering. A base surface that initially projects from the board having a protrusion shaped like a bushing for feeding through the friction-grip part is bent over after soldering onto the printed circuit board. Although the base surface has large-area contact with the head of the friction-grip part, only the bushing-shaped protrusion projects through the printed circuit board and thus rests on its edge on the housing part. The aim of the initially projecting base surface is to avoid the traces of solder that otherwise collect at the edge of the bushing-shaped protrusion when flow soldering. The operation to mount on a housing part a printed circuit board having such a connecting element is complex, as the initially projecting connecting element first has to be secured with the contact finger on the printed circuit board, subsequently bent over into the printed circuit board and then finally fixed with the friction-grip part. In the process it has to be positioned precisely to ensure that the bushing-shaped protrusion is located exactly above the hole in the printed circuit board. To compensate for tolerances in the spacing between contact finger and bushing-shaped protrusion, the hole in the printed circuit board must be larger. The lateral work capacity of the projection is poor and would have to be compensated for by the housing. The area in which the bushing-shaped protrusion contacts with the housing part is restricted to the edge and therefore unfavorable under mechanical load. Some of the forces will be redistributed onto the printed circuit board situated between the base surface and the housing part.

SUMMARY OF THE INVENTION

The invention provides simplest possible electrical connection between the printed circuit board and the housing, whereby it can be guaranteed that this connection will be mechanically stable and last over the required life of the product.

The connecting element according to the invention exhibits a level base surface that provides large area contact with the metallic housing part and has a hole through it into which the friction-grip part is inserted towards the housing. At least one contact finger is situated on the base surface for establishing connection to the printed circuit board. This is, for example, made of the same material as the base surface and arranged vertically on it. A hole is provided in the printed circuit board bonding pad into which the contact finger is inserted and provided with a mechanical and electrically conducting connection to the printed circuit board.

The base surface of an electrically conducting material, preferably metal, is able to absorb the mechanical loads at the friction-grip junction better than the printed circuit board. The printed circuit board is itself fixed to the base surface by means of the contact finger or fingers and electrical connection provided.

Preferably, the contact finger is anchored by means of a press fit in the hole in the printed circuit board bonding pad. Preferably, this can be done by an outside diameter resilient contact finger that, preferably, can be compressed on at least one axial slot while overcoming a restoring force. Once the contact finger has been inserted in the hole in the printed circuit board bonding pad the restoring force provides an additional fixing effect since it presses against the inside surface of the hole, thus strengthening the press fit.

Base surfaces of beryllium copper, for example, prove to be correspondingly dimensionally stable, which means that reliable electrical connection is also guaranteed over the life of the product.

As, in general, printed circuit board bonding pads are already metallized, electrical connection is provided on insertion of the contact finger, although it can be improved by soldering the contact finger. Also, instead of a press fit the contact finger can be fixed in the hole in the printed circuit board bonding pad by soldering.

To improve the distribution of forces at least two contact fingers are provided. Of course, additional contact fingers, for example a three- or four-point fixing, are preferably suitable for absorbing and evenly distributing the torques produced during mounting when driving in a screw, for example, or the forces produced by movements, vibrations or the function carrying the printed circuit board, thus avoiding mechanical overloading at the junction between contact finger and printed circuit board hole.

For the process of electrical connection it proves advantageous to mount at first only the connecting element on the printed circuit board via the contact finger or fingers. The printed circuit board is still easy to handle thereafter; components can still be easily inserted, for example, and the board can be subsequently fixed to the housing part by means of the friction-grip part, i.e. by screw or rivet. It is particularly advantageous to solder the contact finger or fingers onto the printed circuit board together with the electrical components in one operation, for example by flow soldering. Compared to conventional connections that are made additionally secure by soldering there is no need for the extensive operation of subsequently soldering the friction-grip part to the printed circuit board bonding pad and the associated costs thereof. These savings more than compensate for the costs of the additional connecting element according to the invention.

DESCRIPTION OF THE PREFERRED EMBODIMENTS

Figure 1:
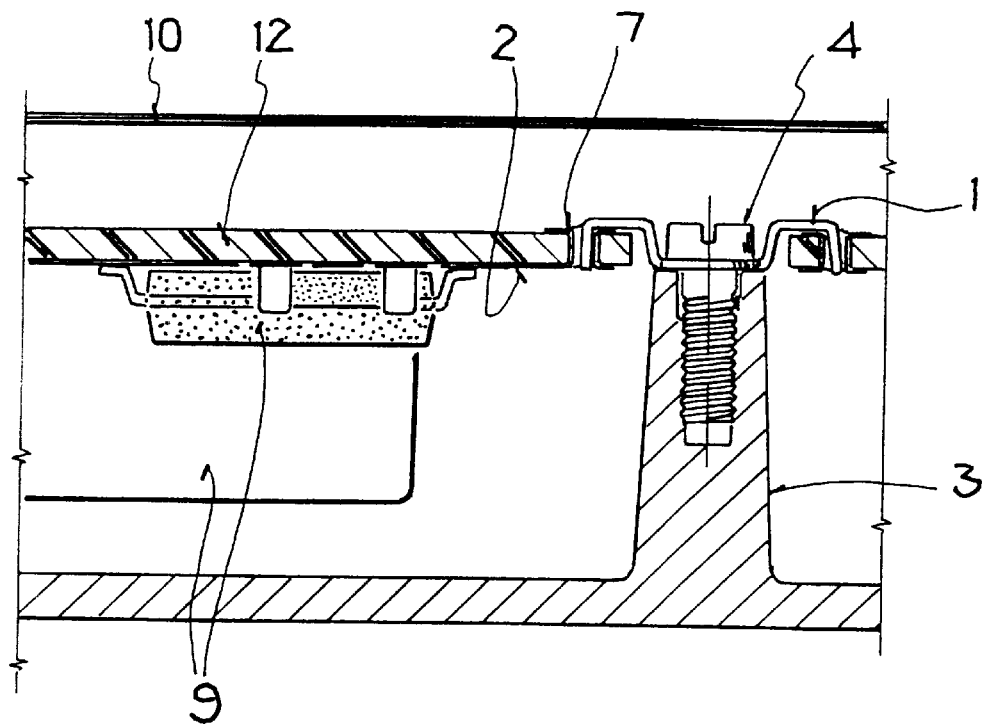
FIG. 1 is a sectional view showing a subassembly where a printed circuit board has been screwed to a metallic housing part by means of the connecting element according to the invention.

FIG. 1 shows a subassembly where a printed circuit board 12 is arranged inside a housing comprising a housing cover 10 and a metallic lower housing section 3. Situated on the printed circuit board 12 are electronic components 9 that are interconnected in accordance with the electrical function by means of conducting tracks on the top side of the board 12. The printed circuit board 12 also exhibits a bonding pad 2 metallized in known fashion in which there is a hole 7. Preferably, the surface of this hole 7 is also metallized, a process already known for push-through components or double-sided printed circuit board configurations. The connecting element 1 is inserted into this hole 7 on the printed circuit board 12. Between hole 7 on the printed circuit board 12 and the contact finger 8.1 of the connecting element 1 depicted in the detail at FIG. 2, a connection is provided by a press fit or soldering. In this version of the invention a round hole 7 is provided in the printed circuit board 12 whose diameter in accordance with the width of the rectangular contact fingers (compare 8.1 in FIG. 2) leads to the rectangular contact finger edges catching in the metallization of hole 7. The contact fingers 8.1 in this version are a single unit made from the same material as the base surface 5 and are shaped by bending so that they compensate for the thickness of the printed circuit board accordingly and the base surface 5 of the connecting element is flush with the underside of the printed circuit board. The friction-grip metallic part 4 is fixed through the hole 6 in the base surface 5 of connecting element 1 (compare also FIG. 2) towards the metallic housing part 3. In the version shown the friction-type connection takes the form of a screwed connection and consists of the screw 4, which by means of the thread in the metallic housing part 3 presses the base surface 5 against said part. Electrical connection is provided between the printed circuit board bonding pad 2, which mostly takes the form of conducting tracks, having the hole 7 and the friction-grip part 4 via the contact fingers 8 and the base surface 5 or direct to the metallic housing part 3.

Figure 2:
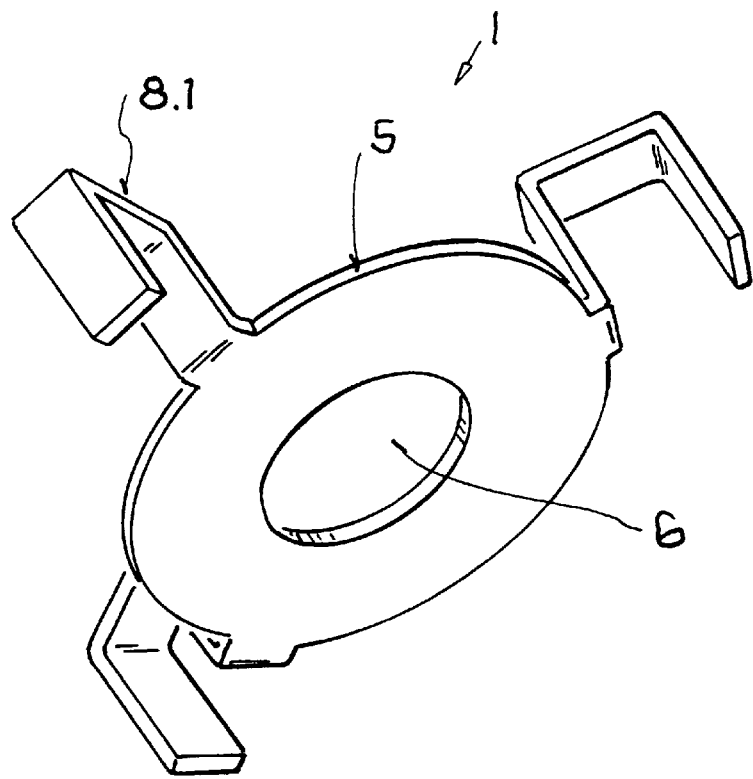
FIG. 2 is a detail view of the connecting element according to FIG. 1.

Again, FIG. 2 shows a detail of the connecting element 1 already described in connection with FIG. 1. In this version three contact fingers are provided on the base surface 5. In addition to the first contact finger required for the electrical contact the other contact fingers are used to distribute the mechanical load more evenly between printed circuit board and housing. The symmetrical 3-point contact serves this purpose very well, for example. In this version the contact fingers are arranged on a short extension piece towards the base surface 5 and practically perpendicular to it. The three bends in total in the contact fingers 8.1 lend the arrangement a certain elasticity, thus balancing out manufacturing tolerances and compensating for mechanical loads.

Figure 3:
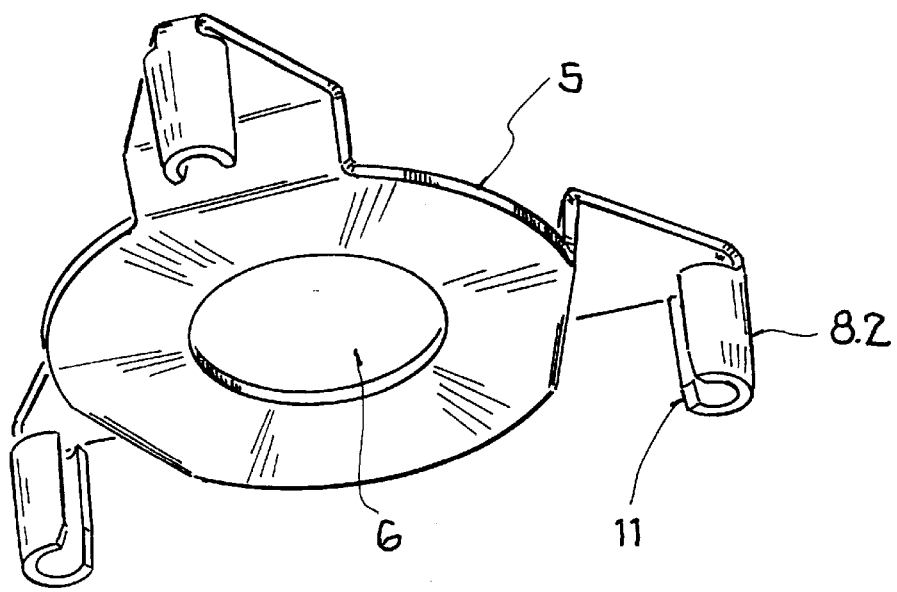
FIG. 3 is a view of a further embodiment of a connecting element on which the contact fingers take the form of lock pins and exhibit an axial slot.

FIG. 3 snows a different connecting element version in which the circular base surface 5 is first extended in the shape of triangle and a contact finger 8.2 that takes the form of a lock pin is arranged in each corner. Each of the contact fingers 8.2 exhibits an axial slot 11 which allows the outside diameter of the contact finger to be inserted into the hole in the printed circuit board by pressing it together and thereafter a restoring force is produced at the printed circuit board hole 7 on one side.

Figure 4:
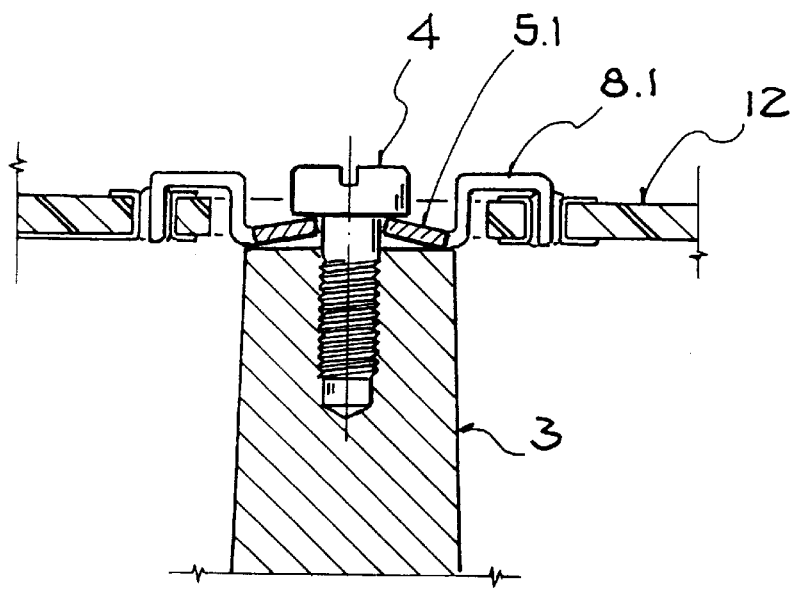
FIG. 4 is a sketch showing the principle of action for connecting elements according to the invention having a base surface that additionally secures or strengthens the friction-type connection.

Next, FIG. 4 shows a supplementary principle of action that can be achieved by corresponding configuration of the base surface 5 as an additional element for securing the friction-type connection between friction-grip part 4 and metallic housing part 3. For example, disk springs or tooth washers are known for securing screwed connections. The generated restoring force that strengthens the friction-type connection is visualized at FIG. 4 by example of a base surface 5.1 design resembling a disk spring. other known state-of-the-art locking options for screwed connections are, for example, wave-shaped or notched washers. Thus, by corresponding configuration of the base surface 5, additional locking instruments can be installed. Such an installation can be integrated very easily in the connecting element and can thus do away with the need for additional operations for separately securing the friction-grip connection, if necessary. This further reduces the mounting work required.

Besides the screwed connections described above rivets or similar fasteners can of course be used to provide the friction-type connection between connecting element and housing part.

What is claimed is:

1. An arrangement for the mechanical connection of a printed circuit board and an electrical connection of a printed circuit board bonding pad (2) with a metallic housing part (3) via a friction-grip metallic part (4), which is fed through a hole (6) in an electrically conductive connecting element (1) and which joins the connecting element (1) to the metallic housing part (3), said arrangement comprising a printed circuit board having electrical components interconnected by conductive tracks on a first surface thereof and a first hole disposed in a bonding pad for at least one of the conductive tracks;

a housing having a metallic housing part disposed below the printed circuit board; and, an electrically conducting connecting element (1) having at least one contact finger (8.1, 8.2) extending into the first hole (7) to connect the connecting element to the printed circuit board bonding pad (2), said connecting element (1) further having a level base surface (5) from which the contact finger extends, and a through hole, with the level base surface having a first side lying on and in contact with the metallic housing part (3) over a large area; and, a friction-grip metallic part extending through said hole in said level base surface, contacting the base surface on a side opposite said first side, and electrically and mechanically connecting said connecting element to said housing part.

2. An arrangement as claimed in claim 1, wherein the printed circuit board (12) has a second hole that is larger than the base surface (5) of the connecting element (1) and the base surface (5) is arranged in this second hole on the printed circuit board (12).

3. An arrangement as claimed in claim 2, wherein the contact fingers (8.1, 8.2) are bent in the shape of a U away from the base surface (5).

4. An arrangement as claimed in claim 3, wherein the contact fingers (8.1, 8.2) are locked in the holes (6) in the printed circuit board bonding pad (2) by a press fit.

5. An arrangement as claimed in claim 4, wherein the base surface (5) is tensioned like a disk spring when providing the friction-type connection between the friction-grip part (4) and the housing part (3).

6. An arrangement as claimed in claim 5, wherein the contact fingers (8.2) are shaped like a bushing and are resilient across their diameter.

7. An arrangement as claimed in claim 6, wherein the outside diameter of the contact finger (8.2) has at least one axial slot (11) and the outside diameter of the contact finger (8.2) can be reduced by pressing it together while overcoming a restoring force.

8. An arrangement as claimed in claim 4, wherein the contact finger (8.1, 8.2) is additionally soldered to the printed circuit board bonding pad (2).

9. An arrangement as claimed in claim 4, wherein the base surface (5) has at least two contact fingers (8.1, 8.2) so as to distribute forces evenly on the printed circuit board (12), especially during the mounting operation or in conjunction with vibrations.

10. An arrangement as claimed in claim 1 wherein the friction-grip metallic part is a screw.

11. A connecting element for the mechanical connection of a printed circuit board and the electrical connection of a printed circuit bonding pad with a metallic housing part via a friction-grip metallic part which is fed through a hole in the connecting element and which joins the connecting element to the metallic housing part; said connecting element comprising: an electrically conducting element having a level base surface for contacting the metallic housing part over a large area, and in which the hole for the friction-grip metallic part extends to connect the connecting element to the metallic housing part; and at least one connecting arm extending from said level base surface to extend into a hole in the printed circuit board to connect the at least one contact arm to a printed circuit board bonding pad when the connecting element is arranged on the circuit board in a hole that is larger than the base surface and is formed in the printed circuit board; and, wherein the contact fingers (8.1, 8.2) are bent in the shape of a U away from the base surface (5).

12. Connecting element as claimed in claim 11, wherein the contact fingers (8.1, 8.2) are locked in the holes (6) in the printed circuit board bonding pad (2) by a press fit.

13. Connecting element as claimed in claim 12, wherein the base surface (5) is tensioned like a disk spring when providing the friction-type connection between the friction-grip part (4) and the housing part (3).

14. Connecting element as claimed in claim 13, wherein the contact fingers (8.2) are shaped like a bushing and are resilient across their diameter.

15. Connecting element as claimed in claim 14, wherein the outside diameter of the contact finger (8.2) has at least one axial slot (11) and the outside diameter of the contact finger (8.2) can be reduced by pressing it together while overcoming a restoring force.

16. Connecting element as claimed in claim 12, wherein the contact finger (8.1, 8.2) is additionally soldered to the printed circuit board bonding pad (2).

17. Connecting element as claimed in claim 12, wherein the base surface (5) has at least two contact fingers (8.1, 8.2) so as to distribute forces evenly on the printed circuit board (12), especially during the mounting operation or in conjunction with vibrations.

* * * * *